(12) United States Patent
Bolotnikov et al.

(10) Patent No.: US 9,806,157 B2
(45) Date of Patent: Oct. 31, 2017

(54) STRUCTURE AND METHOD FOR TRANSIENT VOLTAGE SUPPRESSION DEVICES WITH A TWO-REGION BASE

(71) Applicant: General Electric Company, Schenectady, NY (US)

(72) Inventors: Alexander Viktorovich Bolotnikov, Niskayuna, NY (US); Avinash Srikrishnan Kashyap, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/505,975

(22) Filed: Oct. 3, 2014

(65) Prior Publication Data

US 2016/0099318 A1    Apr. 7, 2016

(51) Int. Cl.
*H01L 29/16*    (2006.01)
*H01L 29/861*    (2006.01)
(Continued)

(52) U.S. Cl.
CPC ...... *H01L 29/1608* (2013.01); *H01L 27/0255* (2013.01); *H01L 29/6606* (2013.01); *H01L 29/861* (2013.01); *H01L 27/0814* (2013.01)

(58) Field of Classification Search
CPC ............... H01L 29/408; H01L 29/1608; H01L 29/8613; H01L 29/66121; H01L 27/0248;
(Continued)

(56) References Cited

U.S. PATENT DOCUMENTS 5,539,604 A    7/1996  Clark et al.
5,880,511 A *  3/1999  Yu ....................... H01L 29/8618
                                                                  257/361
(Continued)

FOREIGN PATENT DOCUMENTS

CN    202423293 U    9/2012
WO    2004036625 A2    4/2004
(Continued)

OTHER PUBLICATIONS

Maier et al., "Modeling of Silicon Carbide (SiC) Power Devices for Electronic Switching in Low Voltage Applications", Power Electronics Specialists Conference, 2004. PESC 04. 2004 IEEE 35th Annual, vol. No. 4, pp. 2742-2745, 2004.
(Continued)

*Primary Examiner* — Cheung Lee
*Assistant Examiner* — Stephen C Smith
(74) *Attorney, Agent, or Firm* — General Electric Company

(57) ABSTRACT

A transient voltage suppression (TVS) device and a method of forming the device are provided. The TVS device includes a first layer of wide band-gap semiconductor material formed of a first conductivity type material, a second layer of wide band-gap semiconductor material formed of a second conductivity type material over at least a portion of the first layer, the second layer including a first concentration of dopant. The TVS device further including a third layer of wide band-gap semiconductor material formed of the second conductivity type material over at least a portion of the second layer, the third layer including a second concentration of dopant, the second concentration of dopant being different than the first concentration of dopant. The TVS device further including a fourth layer of wide band-gap
(Continued)

semiconductor material formed of the first conductivity type material over at least a portion of the third layer.

12 Claims, 3 Drawing Sheets

(51) Int. Cl.
*H01L 29/66* (2006.01)
*H01L 27/02* (2006.01)
*H01L 27/08* (2006.01)

(58) Field of Classification Search
CPC . H01L 27/0255; H01L 27/0814; H01L 23/60; H01L 23/0255; H01L 23/0814; H01L 2224/8011; H01L 2924/302; H01L 29/861; H01L 29/6606
See application file for complete search history.

(56) References Cited

U.S. PATENT DOCUMENTS

| | | | |
|---|---|---|---|
| 5,900,651 A | 5/1999 | Kitagawa et al. | |
| 6,015,999 A | 1/2000 | Yu et al. | |
| 6,392,266 B1 * | 5/2002 | Robb | H01L 29/861 257/314 |
| 6,734,462 B1 | 5/2004 | Shah | |
| RE38,608 E * | 10/2004 | Yu | H01L 29/866 257/361 |
| 7,719,813 B2 | 5/2010 | Chen | |
| 8,270,131 B2 * | 9/2012 | Klein | H01L 27/0259 257/355 |
| 8,441,765 B2 | 5/2013 | Barbier et al. | |
| 8,445,917 B2 | 5/2013 | Haney et al. | |
| 8,530,902 B2 * | 9/2013 | Kashyap | H01L 23/3185 257/76 |
| 8,557,671 B2 | 10/2013 | Guan et al. | |
| 8,710,627 B2 | 4/2014 | Guan et al. | |
| 8,730,629 B2 * | 5/2014 | Kashyap | H01L 29/36 361/111 |
| 2004/0070029 A1 | 4/2004 | Robb et al. | |
| 2006/0216913 A1 * | 9/2006 | Kung | H01L 29/0661 438/478 |
| 2009/0290276 A1 | 11/2009 | Carcouet et al. | |
| 2010/0244090 A1 | 9/2010 | Bobde et al. | |
| 2010/0321840 A1 | 12/2010 | Bobde | |
| 2011/0089483 A1 * | 4/2011 | Reynes | H01L 29/0878 257/329 |
| 2012/0127619 A1 | 5/2012 | Mikolajczak | |
| 2013/0240903 A1 * | 9/2013 | Kashyap | H01L 21/50 257/77 |
| 2013/0258541 A1 | 10/2013 | Knobloch et al. | |

FOREIGN PATENT DOCUMENTS

| | | |
|---|---|---|
| WO | 2008063592 A2 | 5/2008 |
| WO | 2013119548 A1 | 8/2013 |

OTHER PUBLICATIONS

Handt et al., "Intelligent, Compact and Robust Semiconductor Circuit Breaker Based on Silicon Carbide Devices", Power Electronics Specialists Conference, 2008. PESC 2008. IEEE, pp. 1586-1591, Jun. 15-19, 2008.

European Search Report and Opinion issued in connection with corresponding EP Application No. 15164717.9 on Oct. 7, 2015.

Bin et al., "Punchthrough Transient Voltage Suppressor for EOS/ESD Protection of Low-Voltage IC's", Electrical Overstress/ Electrostatic Discharge Symposium Proceedings, 1995, pp. 27-33, Sep. 12-14, 1995, Phoenix, AZ, USA.

* cited by examiner

STRUCTURE AND METHOD FOR TRANSIENT VOLTAGE SUPPRESSION DEVICES WITH A TWO-REGION BASE

BACKGROUND

This description relates to semiconductor devices, and, more particularly, to transient voltage suppressor (TVS) diodes having a two-region base and methods of forming them using wide-band-gap materials.

At least some known punch-through transient voltage suppression (TVS) semiconductor devices include a uniformly doped base layer. The TVS device reaches breakdown when a depletion region of a reverse biased p-n junction reaches another p-n junction depletion region (or open base breakdown conditions are achieved). The blocking capability of the TVS device is defined by its base thickness and doping (amount of doping to be depleted to reach punch-through conditions). Punch-through limited breakdown design allows a simplification of the structure in such a way that no special edge termination is required and the TVS device can be fabricated using a mesa formation process. Although silicon carbide (SiC) can withstand up to about 3 Megavolt/centimeter (MV/cm), the breakdown strength of the mesa surface is usually 2-3 times lower, thus it is required to design the TVS device in a such way that an electric field in the TVS device is confined in the bulk region or is maintained less than a surface breakdown strength at all voltages up to breakdown.

The breakdown voltage and maximum electric field in a base of the TVS device at breakdown is at least partially dependent on a base thickness and/or doping. Generally, for a higher blocking voltage capability of the TVS device, the base is thicker and its doping is lower than for devices having a lower blocking voltage. Designing the TVS device with a specific breakdown voltage (BV) and low electric field ($E_{max}$) requires an even thicker base and lower doping.

For example, for an NPN or PNP TVS device with a breakdown voltage (BV) equal to approximately 600 volts (V), the SiC TVS device can have a base that is approximately 6 micrometers (μm) thick and has a doping concentration of approximately $2 \times 10^{16}$ per centimeters cubed ($cm^{-3}$). At breakdown voltage the electric field will reach approximately 2.2 Megavolts/centimeter (MV/cm). If for the same BV=600V, a lower electric field is required, for example, a maximum electric field ($E_{max}$)<1.1 MV/cm, the base region thickness would need to be increased to approximately 11 μm and its doping would have to be reduced to, for example, below $5.5 \times 10^{16}$ $cm^{-3}$. The drawback of "low electric field" TVS design is the requirement of a thick (especially at high BV) base region. The fabrication of such a high TVS mesa structure requires a deep etch process and a special mask protecting active area of the device during the etch process.

Increasing a thickness of the base layer to achieve a greater breakdown voltage has practical limits. Using a typical three layer NPN structure or PNP structure for any voltage, beyond a certain point, beyond a certain breakdown voltage, the increasing thickness of the base layer increases the resistance of the device itself, increases voltage clamping factor of TVS and thus worsens clamping capability of device.

BRIEF DESCRIPTION

In one embodiment, a transient voltage suppression (TVS) device includes a first layer of wide band-gap semiconductor material formed of a first conductivity type material, a second layer of wide band-gap semiconductor material formed of a second conductivity type material over at least a portion of the first layer, the second layer including a first concentration of dopant, and a third layer of wide band-gap semiconductor material formed of the second conductivity type material over at least a portion of the second layer, the third layer including a second concentration of dopant, the second concentration of dopant being different than the first concentration of dopant. The TVS device also includes a fourth layer of wide band-gap semiconductor material formed of the first conductivity type material over at least a portion of the third layer.

In another embodiment, a method of forming a transient voltage suppression (TVS) assembly includes providing a silicon carbide semiconductor substrate having a first surface and an opposite second surface, forming a first silicon carbide semiconductor layer having a conductivity of a first polarity over at least a portion of the first surface, forming a second silicon carbide semiconductor layer having a conductivity of a second polarity over at least a portion of the first layer, and forming a third silicon carbide semiconductor layer having a conductivity of the second polarity over at least a portion of the second layer. The method also includes forming a fourth silicon carbide semiconductor layer having a conductivity of the first polarity over at least a portion of the third layer, and forming electrical contacts to the device on the second surface and on the third surface.

In yet another embodiment, a transient voltage suppression (TVS) assembly for protecting electronic equipment from transient electrical energy includes a plurality of TVS devices coupled together in at least electrical parallel, the plurality of TVS devices each including a first layer formed of a wide band-gap semiconductor material of a first conductivity type, a second layer formed of the wide band-gap semiconductor material of a second conductivity type, a third layer formed of the wide band-gap semiconductor material of the second conductivity type, and a fourth layer formed of the wide band-gap semiconductor material of the first conductivity type.

DRAWINGS

These and other features, aspects, and advantages of the present disclosure will become better understood when the following detailed description is read with reference to the accompanying drawings in which like characters represent like parts throughout the drawings, wherein.

Figure 1:
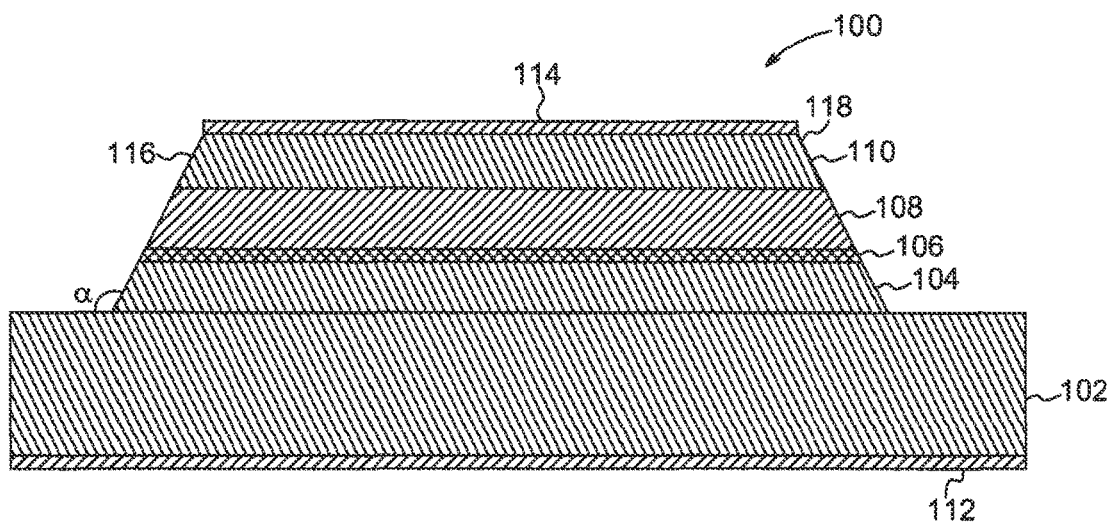
FIG. 1 is a cross-sectional view of a transient voltage suppression (TVS) semiconductor device.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, references to n+ or p+ type conductivity materials imply a relatively high concentration of dopant impurities (e.g. $1\times10^{18}$ to $1\times10^{21}$ cm$^{-3}$). References to n− or p− type conductivity materials imply a relatively lower concentration of dopants (e.g. $1\times10^{14}$ to $1\times10^{17}$ cm$^{-3}$).

Embodiments of the present disclosure describe the design and process of fabrication of a unidirectional punch-through transient voltage suppressor (TVS) or circuit protection devices using wide-band-gap semiconductors having a blocking or base region including two layers having specific doping concentrations and thickness of each layer. This design allows independent control of breakdown voltage (BV) and electric field (E) in the TVS device and permits a reduction of a thickness of the blocking region. The independent electric field control enables designs with no edge termination, thus a simplified etch process to form vertical mesa and surface passivation to minimize leakage current along mesa sidewalls can be utilized. The simplification of device structure (no termination) and reduced mesa height (thus simpler fabrication process) result in overall device cost reduction.

The disclosed design permits a reduced base thickness without sacrificing BV or $E_{max}$ requirements. The base of the TVS structure includes two regions, a relatively thicker low doped (base region 1) and a relatively thinner and a relatively higher doped (base region 2). In this structure, depletion propagates through the lower doped region first and higher doped region second, until it reaches the opposite pn junction.

The following description refers to the accompanying drawings, in which, in the absence of a contrary representation, the same numbers in different drawings represent similar elements.

FIG. 1 is a cross-sectional view of an embodiment of a transient voltage suppression (TVS) semiconductor device 100. In the exemplary embodiment, TVS device 100 includes a structure that is formed of a substrate 102 of, for example, silicon carbide having an n type conductivity, an epitaxially grown n+ type conductivity layer 104, a first epitaxially grown p− layer 106 coupled in electrical contact with layer 104, a second epitaxially grown p− layer 108 coupled in electrical contact with layer 106, and an epitaxially grown n+ layer 110 coupled in electrical contact with second epitaxially grown p− layer 108. Substrate 102 is typically doped with a dopant of a first conductivity type during substrate growth or diffusion processes. In some embodiments, the TVS structure includes a mesa structure with negative beveled edges, 116 and 118, respectively. An angle α may extend through 90° to 135°. Although, described and illustrated as having a negative beveled edge, the mesa structure may also have vertical or nearly vertical edges. Because TVS device 100 is designed to maintain the electric field in TVS device 100 below a critical electric field level by shaping the electric field such no avalanching occurs within TVS device and across edges 116 and 118, an angle of the beveled edge is not critical to the operation of TVS device 100.

In various other embodiments, n+ layers 104 and 110 and/or p− layers 106 and 108 are formed by ion-implantation. For example, in one embodiment, substrate 102 is an n+ layer, a first n+ layer 104 is formed on substrate 102, a very lightly doped n− epitaxy layer is formed on first n+ layer 104, a first portion of the n− epitaxy layer, to a predetermined depth, is then converted to a p− layer 106 having a first dopant concentration by ion implantation, a second portion of the n− epitaxy layer, to a predetermined depth, is then converted to a p− layer 108 having a first dopant concentration by ion implantation, and n+ layer 110 may also be formed on p− layer 108 with an n+ implantation.

For relatively low voltage applications, forming p− layers 106 and 108 and/or n+ layers 104 and 110 by ion implantation may provide tighter control of the integrated charge of these layers, which in turn permits more accurate control of the electrical characteristics of TVS device 100.

A first electrical contact or cathode 112 is coupled in electrical contact with substrate 102. A second electrical contact or anode 114 is coupled in electrical contact with epitaxially grown or implanted n+ layer 110. TVS device 100 operates using "punch-through," or also known as, "reach-through" physics such that as the voltage across TVS device 100 is increased, a depletion region extends all across p− layers 106 and 108 reaching n+ layer 106 and n+ layer 110. This leads to a condition known as "punch-through" and large amounts of current are able to flow through TVS device 100. TVS device 100 is able to maintain this condition with minimal change in the voltage across it. In the exemplary embodiment, punch-through operation is achieved if $N_a*t_{p-}/\in\in_0$ is less than $E_c$, where $N_a$ is acceptor doping concentration in layers 106 and 108; $t_{p-}$ is the thickness of layers 106 and 108; $\in$ is material permittivity; $E_c$ is critical electric field. In embodiments where TVS device 100 is formed of a PNP junction, punch-through operation is achieved if $N_d*t_{n-}/\in\in_0$ is less than $E_c$, where $N_d$ is the donor doping concentration in layer 108; $t_{n-}$ is the thickness of layer 108.

In various embodiments, SiC TVS device 100 is sized and formed to ensure a maximum electric field internal to the semiconductor material of TVS device 100 is maintained less than about two megavolts per centimeter. In other embodiments, using other semiconductors, the maximum electric field internal to the semiconductor material of TVS device 100 is maintained at a value corresponding to the semiconductor material used. Additionally, TVS device 100 is configured to maintain the difference between the zener and blocking voltage of less than 5%. As used herein, blocking voltage refers to the highest voltage at which TVS device 100 does not conduct or is still in an "off" state. Moreover, TVS device 100 is configured to maintain an electrical leakage current of less than approximately 1.0 microamp/cm² up to approximately the punch-through voltage of TVS device 100 at room temperature and less than 100.0 microamp/cm² up to approximately the punch-through voltage at operating temperatures of up to 225° Celsius.

In various embodiments, TVS device 100 is configured to exhibit punch-through characteristics between approximately 5.0 volts and approximately 75.0 volts. In various other embodiments, TVS device 100 is configured to exhibit punch-through characteristics between approximately 75.0 volts and approximately 200.0 volts. In still other embodiments, TVS device 100 is configured to exhibit punch-through characteristics at voltages greater than approximately 200 volts.

First epitaxially grown p– layer 106 and second epitaxially grown p– layer 108 are formed such that layer 106 is relatively thinner than layer 108 and a doping concentration of layer 106 includes a relatively higher concentration of dopant than layer 108. Varying the relative thickness of layers 106 and 108 and the relative doping of layers 106 and 108 permit controlling an electric field within TVS device 100 at breakdown. Forming the base of TVS device 100 of two separate layers having different thickness and dopant concentration provides an ability to make a total thickness of layers 106 and 108 thinner than an equivalent homogeneously doped layer.

Moreover, the disclosed design permits a reduction of base thickness without sacrificing BV or $E_{max}$ requirements. The base of TVS structure 100 includes two regions: a relatively thicker, relatively lower doped layer 108 and a relatively thinner, relatively higher doped layer 106. In this structure depletion propagates through low doped region first and higher doped region second, till it reaches opposite pn junction.

Figure 4:
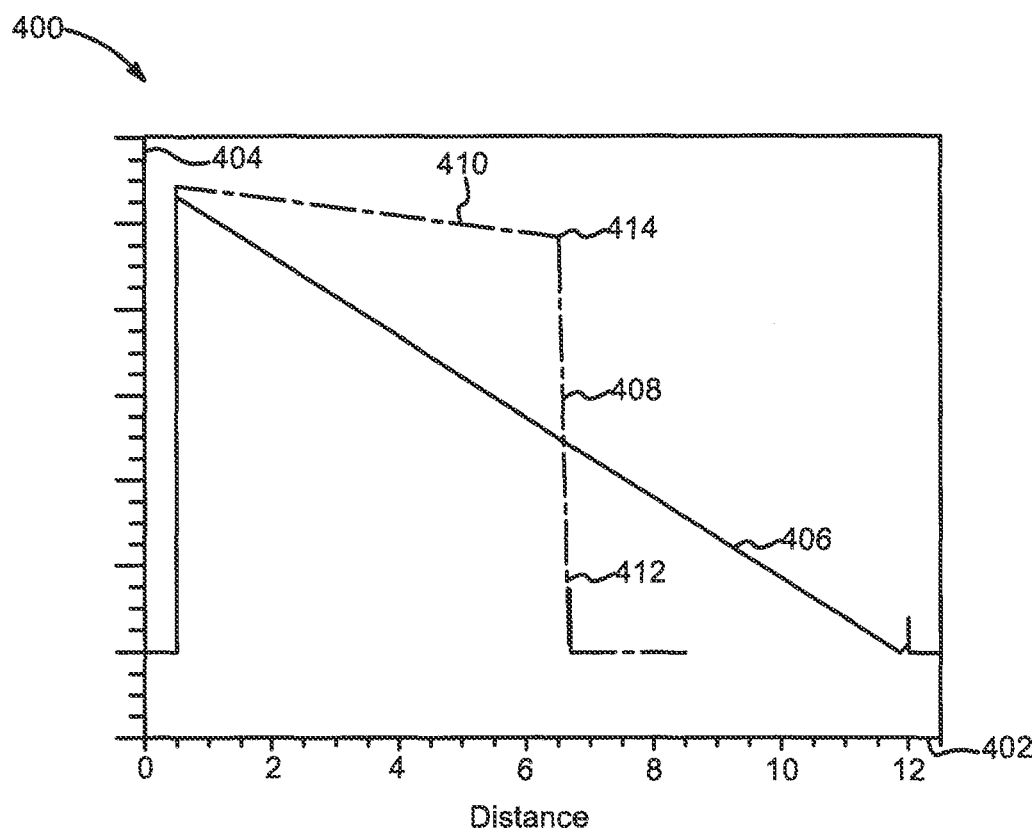
FIG. 4 is a graph of an electric field in the base region of a TVS device structure having a single homogeneous region base and an electric field in the base region of a TVS device structure having a base region including two differently doped regions as illustrated in FIG. 1.

If the doping of layer 108 is very low, the electric field distribution in it becomes close to constant and drops rapidly as soon as it reaches layer 106. Thus in the two layer base structure of TVS device 100, the maximum electric field ($E_{max}$) approaches V/t_base dependence, where V is the applied voltage and t_base is total base thickness. As illustrated in FIG. 4, a TVS device with a uniformly doped base, the electric field curve has triangular shape, and thus $E_{max} \approx 2V/t\_base$. This means that the two layer base TVS device structure permits achieving a higher BV for the same base thickness and having the same $E_{max}$. Alternatively, the two layer base TVS device structure permits a reduction in base thickness while still providing the same BV and $E_{max}$. Because the thickness of layer 106 has only a minor impact on $E_{max}$, from a practical point of view, layer 106 is formed as thin as possible to reduce for example, mesa height, etch duration during fabrication.

Figure 2:
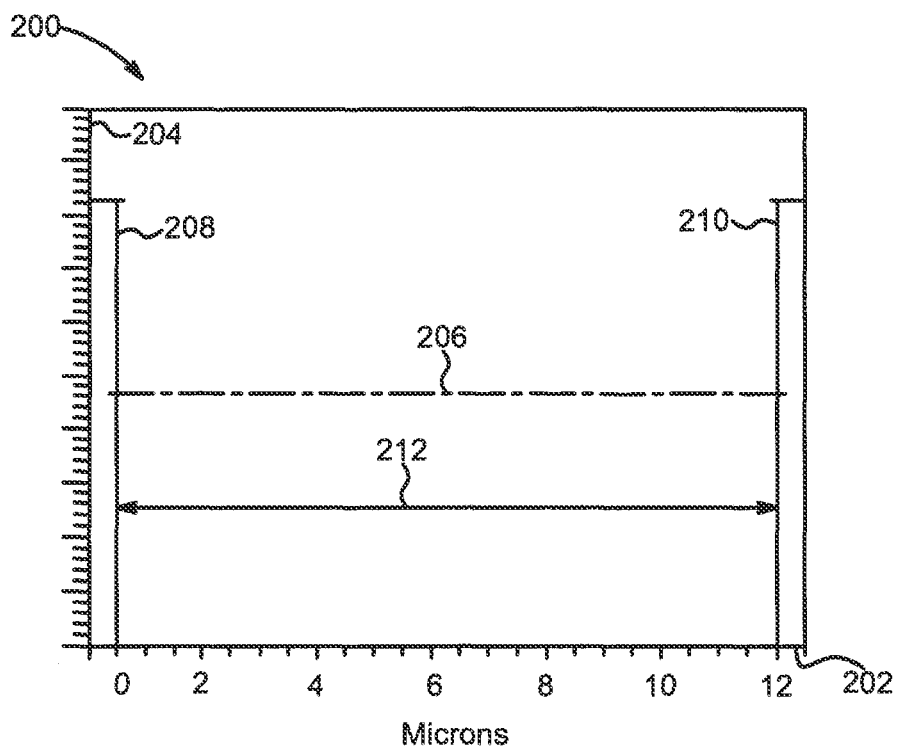
FIG. 2 is a graph of a doping profile (acceptors and donors) in a TVS device structure having a uniformly doped base region.

FIG. 2 is a graph 200 of a doping profile (acceptors and donors) in a TVS device structure having a uniformly doped base region and providing a BV=620V with E<1.1 MV/cm. Graph 200 includes an x-axis 202 graduated in units of base region thickness, for example, microns and a y-axis 204 graduated in units of dopant concentration, for example, electrically activated dopant ions per cm³. A trace 206 illustrates a level of acceptor concentration along a depth of the uniformly doped base region, which is also an indicator of charge contained in the uniformly doped base region. Traces 208 and 210 illustrate a concentration of donor concentration along the depth of the uniformly doped n⁺ regions, which gives an indication of the thickness of the uniformly doped base region. A distance 212 between the vertical portions of traces 208 and 210 indicates the physical distance between the pn junctions at the interface between the base region and the adjacent layers in the TVS device. In the example embodiment, the thickness can be determined to be the difference between 12 microns from trace 210 and 0.5 microns from trace 208 or approximately 11.5 microns.

Figure 3:
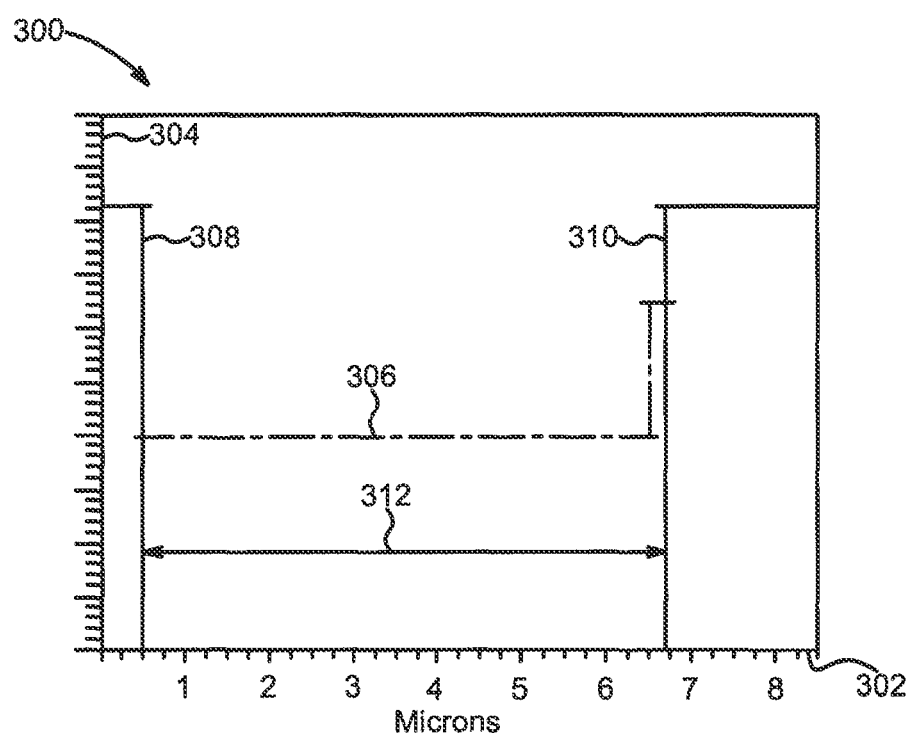
FIG. 3 is a graph of a doping profile (acceptors and donors) in the TVS device structure shown in FIG. 1 and having a base region including two differently doped regions.

FIG. 3 is a graph 300 of a doping profile (acceptors and donors) in a TVS device structure having a base region including two differently doped regions as illustrated in FIG. 1 and providing the same parameters as the TVS device with the uniformly doped base region shown in FIG. 2, BV=620V with E<1.1 MV/cm.

Graph 300 includes an x-axis 302 graduated in units of base region thickness, for example, microns and a y-axis 304 graduated in units of dopant concentration, for example, dopant ions per cm³. A trace 306 illustrates a level of acceptor concentration along a depth of the uniformly doped base region, which is also an indicator of charge contained in the uniformly doped base region. Traces 308 and 310 illustrate a concentration of donor concentration along the depth of the uniformly doped n⁺ regions, which gives an indication of the thickness of the non-uniformly doped base region. A distance 312 between the vertical portions of traces 308 and 310 indicates the physical distance between the pn junctions at the interface between the base region and the adjacent layers in the TVS device. In the example embodiment, the thickness can be determined to be the difference between 6.75 microns from trace 310 and 0.5 microns from trace 308 or approximately 6.25 microns.

As shown in FIGS. 2 and 3, due to different electric field distribution (see FIG. 4) the design with two-layer base (shown in FIG. 1) achieves the same BV and $E_{max}$ in a thinner total base region thickness.

FIG. 4 is a graph 400 of an electric field in the TVS device having a single homogeneous region base and an electric field in the TVS device having a base region including two differently doped regions as illustrated in FIG. 1. Due to low doping of the base, the electric field is mostly confined in the base region of TVS device structures. Each of the TVS device structures illustrated provides the same parameters, BV=620V with E<1.1 MV/cm.

Graph 400 includes an x-axis 402 graduated in units of base region thickness, for example, microns and a y-axis 404 graduated in units of electric field, for example, volts/cm. A trace 406 illustrates the electric field in the TVS device structure having a single homogeneous region base. A trace 408 illustrates the electric field in the TVS device structure having a base region including two differently doped regions such as layers 106 and 108 (shown in FIG. 1).

The relation between electric field, breakdown voltage and base doping/thickness is defined by a Poisson equation:

$$\frac{\partial^2 \psi}{\partial x^2} = \frac{\rho}{\varepsilon}, \qquad (1)$$

where

ψ represents potential,
ρ represents charge density
∈ represents dielectric constant and
x represents a position coordinate.

The applicable ranges for a SiC punch-through TVS with two-layer base structure are defined:

Electric field in base region at breakdown conditions:

$$E(x) = \int_0^{t\_base} \frac{q \times N_{-base(x)}}{\varepsilon} \times dx, \qquad (2)$$

where

N_base(x) is the doping concentration in base region;
t_base=t_base1+t_base2 is the total base thickness;
q is electron charge.

$$BV \approx \int_0^{Emax} E(x) \times dx \qquad (3)$$

The equations above permit an estimation of base doping/thickness to obtain required BV, $E_{max}$. Note that multiple solutions are possible.

To minimize the thickness of base region, the following design rules (equations 4 and 5) are used:

$$N\_base1 * t\_base1 \leq 10 * N\_base2 * t\_base2, \text{ where} \qquad (4)$$

N_base1 represents a concentration of dopant in layer 108,
for example, $1 \times 10^{14}$ cm$^{-3}$ ≤N_base1≤ $2 \times 10^{17}$ cm$^{-3}$,
t_base1 represents a thickness of layer 108,
for example, t_base1≥0.5 um,
N_base2 represents a concentration of dopant in layer 106,
for example, N_base2≤ $1 \times 10^{18}$ cm$^{-3}$, and
t_base2 represents a thickness of layer 106,
for example, 0.1 um≤t_base2≤5 um.

$$0.1 \text{ um} \leq t\_base2 \leq 0.2 * t\_base1 \qquad (5)$$

Trace 406 exhibits a substantially linear electric field through the thickness of the single homogeneous base region. Trace 408 exhibits a first linear portion 410, a second linear portion 412, and a knee 414 at a junction between layer 106 and layer 108.

Figure 5:
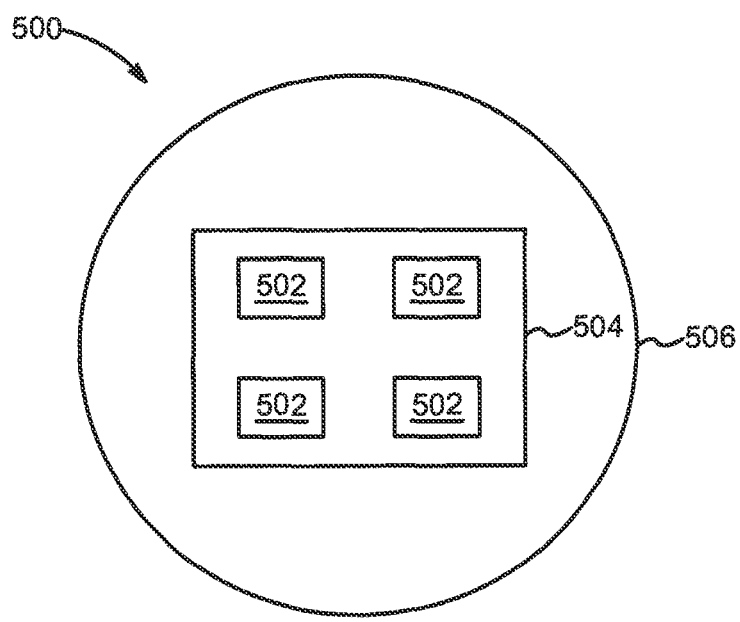
FIG. 5 is a plan view of a transient voltage suppression (TVS) assembly for protecting electrical equipment from transient electrical energy configured to divert electrical energy from the electrical equipment.

FIG. 5 is a plan view of a transient voltage suppression (TVS) assembly 500 for protecting electrical equipment from transient electrical energy configured to divert electrical energy from the electrical equipment. In the example embodiment, TVS assembly 500 includes a plurality of TVS devices 502 coupled together in at least electrical parallel. The plurality of TVS devices 502 are formed on a first die 504 and packaged into a single integrated circuit package 506. In various embodiments, multiple dies of TVS devices 502 are packaged together in a single integrated circuit package 506 or plurality of TVS devices 506 are formed monolithically on a single die.

The punch-through TVS design described herein permits a reduction of a thickness of the blocking region (base) without sacrificing device performance. The independent electric field control enables designs with no edge termination, thus reducing the cost of device fabrication and overall device cost.

The above-described embodiments of a structure and a method of forming a transient voltage suppression (TVS) device having a two region base, each region being independently controlled for thickness and dopant concentration provides a cost-effective and reliable means for improving circuit protection using TVS devices. More specifically, the structure and methods described herein facilitate reducing a thickness of a TVS device while maintaining circuit protection capabilities as compared to a TVS device having a conventional single layer base region. As a result, the structure and methods described herein facilitate improving the circuit protection capability of TVS devices in a cost-effective and reliable manner.

Exemplary embodiments of transient voltage suppression (TVS) devices having multiple regions, and methods of forming such devices are not limited to the specific embodiments described herein, but rather, components of devices and/or steps of the methods may be utilized independently and separately from other components and/or steps described herein. For example, the methods may also be used in combination with other devices, and are not limited to practice with only the TVS devices and methods as described herein. Rather, the exemplary embodiment can be implemented and utilized in connection with many other TVS devices without limitation.

Although specific features of various embodiments of the disclosure are shown in some drawings and not in others, this is for convenience only. In accordance with the principles of the disclosure, any feature of a drawing may be referenced and/or claimed in combination with any feature of any other drawing.

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A transient voltage suppression (TVS) device comprising:
   a first layer of wide band-gap semiconductor material formed of a first conductivity type material;
   a second layer of wide band-gap semiconductor material formed of a second conductivity type material over at least a portion of the first layer, the second layer comprising a first thickness and a first concentration of dopant;
   a third layer of wide band-gap semiconductor material formed of the second conductivity type material over at least a portion of the second layer, the third layer comprising a second thickness and a second concentration of dopant, the second thickness being larger than the first thickness, the second concentration of dopant being less than the first concentration of dopant; and
   a fourth layer of wide band-gap semiconductor material formed of the first conductivity type material over at least a portion of the third layer, wherein a concentration of dopant in the second layer and the third layer is determined using:

$$N\text{thirdlayer} * t\text{thirdlayer} \leq 10 * N\text{secondlayer} * t\text{secondlayer},$$
   where Nthirdlayer represents a concentration of dopant in the third layer, wherein a concentration of dopant in the third layer is, $1 \times 10^{15}$ cm$^{-3}$ <Nthirdlayer≤ $2 \times 10^{17}$ cm$^{-3}$,
   tthirdlayer represents a thickness of the third layer,
   Nsecondlayer represents a concentration of dopant in the second layer, and tsecondlayer represents a thickness of the second layer, wherein a thickness of the second layer is, tsecondlayer>2 um.

2. The device of claim 1, further comprising a first electrical contact surface on a side of the first layer opposite the second layer.

3. The device of claim 2, further comprising a second electrical contact surface on a side of the fourth layer opposite the third layer.

4. The device of claim 1, wherein a concentration of dopant in the second layer is, Nsecondlayer≦1×10$^{18}$cm$^{-3}$.

5. The device of claim 1, wherein a thickness of the third layer is, tthirdlayer≧0.5 um.

6. The device of claim 1, wherein said TVS device operates using punch-through physics.

7. The device of claim 6, wherein said TVS device is configured to exhibit punch-through characteristics between approximately 5.0 volts and approximately 75.0 volts.

8. The device of claim 6, wherein said TVS device is configured to exhibit punch-through characteristics between approximately 75.0 volts and approximately 200.0 volts.

9. The device of claim 6, wherein said TVS device is configured to exhibit punch-through characteristics at voltages greater than approximately 200 volts.

10. A transient voltage suppression (TVS) assembly for protecting electrical equipment from transient electrical energy configured to divert electrical energy from the electrical equipment, said TVS assembly comprising:
a plurality of TVS devices coupled together in at least electrical parallel, said plurality of TVS devices each comprising:
a first layer formed of a wide band-gap semiconductor material of a first conductivity type;
a second layer formed of the wide band-gap semiconductor material of a second conductivity type, the second layer comprising a first thickness and a first concentration of dopant;
a third layer of wide band-gap semiconductor material formed of the second conductivity type material over at least a portion of the second layer, the third layer comprising a second thickness and a second concentration of dopant, the second thickness being larger than the first thickness, the second concentration of dopant being less than the first concentration of dopant; and
a fourth layer of wide band-gap semiconductor material formed of the first conductivity type material over at least a portion of the third layer, wherein a concentration of dopant in the second layer and the third layer is determined using:

$$Nthirdlayer*tthirdlayer \leq 10*Nsecondlayer*tsecondlayer,$$
where

Nthirdlayer represents a concentration of dopant in the third layer, wherein a concentration of dopant in the third layer is, 1×10$^{15}$cm$^{-3}$ <Nthirdlayer≦2×10$^{17}$cm$^3$,
tthirdlayer represents a thickness of the third layer,
Nsecondlayer represents a concentration of dopant in the second layer, and
tsecondlayer represents a thickness of the second layer, wherein a thickness of the second layer is, tsecondlayer>2 um.

11. The assembly of claim 10, wherein said plurality of TVS devices are formed on a first die and packaged into a single integrated circuit package.

12. The assembly of claim 10, wherein said plurality of TVS devices are formed monolithically on a single die.

* * * * *